(12) United States Patent
Bürkert et al.

(10) Patent No.: US 11,977,400 B2
(45) Date of Patent: May 7, 2024

(54) ANALOGUE VOLTAGE PROGRAMMING

(71) Applicant: ebm-papst Mulfingen GmbH & Co. KG, Mulfingen (DE)

(72) Inventors: Martin Bürkert, Dörzbach-Hohebach (DE); Thomas Kilian, Krautheim (DE); Sebastian Schroth, Kupferzell (DE); Fabian Schneider, Rot am See (DE); Georg Wiedmann, Ilshofen (DE)

(73) Assignee: ebm-papst Mulfingen GmbH & Co. KG, Mulfingen (DE)

( * ) Notice: Subject to any disclaimer, the term of this patent is extended or adjusted under 35 U.S.C. 154(b) by 270 days.

(21) Appl. No.: 17/598,360

(22) PCT Filed: May 14, 2020

(86) PCT No.: PCT/EP2020/063430
§ 371 (c)(1),
(2) Date: Sep. 27, 2021

(87) PCT Pub. No.: WO2020/239454
PCT Pub. Date: Dec. 3, 2020

(65) Prior Publication Data
US 2022/0187860 A1 Jun. 16, 2022

(30) Foreign Application Priority Data
May 28, 2019 (DE) ...................... 10 2019 114 228.8

(51) Int. Cl.
*G05F 1/46* (2006.01)
(52) U.S. Cl.
CPC .............. *G05F 1/468* (2013.01); *G05F 1/462* (2013.01); *G05F 1/461* (2013.01)

(58) Field of Classification Search
CPC .......... G05F 1/461; G05F 1/462; G05F 1/468; G11C 5/147; G11C 17/16; H01C 17/23; H03K 2217/0027
See application file for complete search history.

(56) References Cited

U.S. PATENT DOCUMENTS

| | | | | |
|---|---|---|---|---|
| 4,367,437 A * | 1/1983 | Mikami | .................. | G05F 1/575 323/280 |
| 4,686,384 A * | 8/1987 | Harvey | .................... | G05F 1/468 365/96 |

(Continued)

FOREIGN PATENT DOCUMENTS

| | | |
|---|---|---|
| DE | 69322751 T2 | 7/1999 |
| DE | 102017122497 A1 | 3/2019 |

(Continued)

OTHER PUBLICATIONS

Full machine translation of EP-0632465-A1, original document and already of record. Originally published Jan. 4, 1995. (Year: 1995).*

(Continued)

*Primary Examiner* — Fred E Finch, III
(74) *Attorney, Agent, or Firm* — Harness, Dickey & Pierce, P.L.C.

(57) ABSTRACT

An analog circuit arrangement (1) to variably set a voltage $U_{out}$, within defined voltage limits, has a non-inverting adder (10) with a positive input (11). A voltage divider (20), with at least a first stage (21) and a second stage (22), is connected to the positive input (11) of the adder (10). At least one stage has a parallel circuit of n resistors (R1, R2, . . . , Rn) that are each connected in series in a conduction path (L1, L2, . . . , Ln) to an overcurrent protection device (F1, F2, . . . , Fn). At least one device (30) actively changes one or more of the overcurrent protection (Continued)

Figure 1:
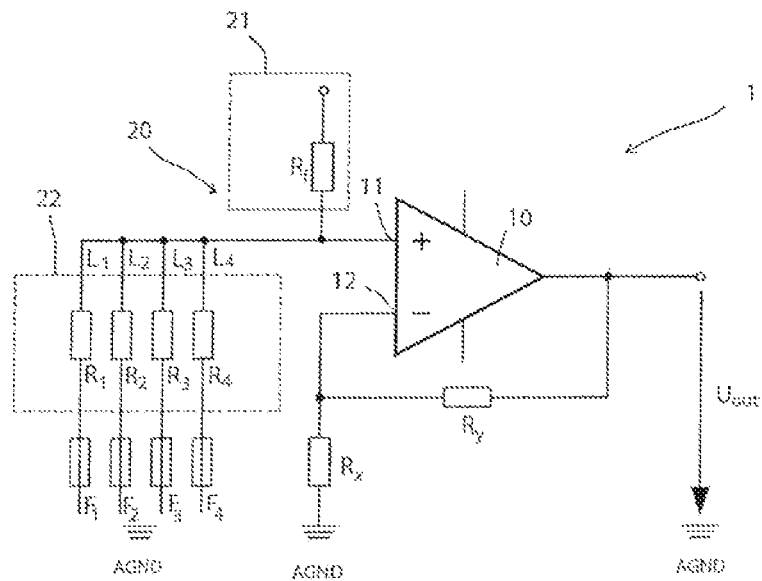

devices (F1, F2, ..., Fn) into a state that interrupts the respective affected conduction path (L1, L2, ..., Ln).

9 Claims, 3 Drawing Sheets

(56) References Cited

U.S. PATENT DOCUMENTS

| | | | |
|---|---|---|---|
| 5,434,498 A | 7/1995 | Cordoba et al. | |
| 2004/0145242 A1* | 7/2004 | Rodriguez | H02M 3/285 307/11 |
| 2006/0152990 A1 | 7/2006 | Huang | |
| 2009/0295462 A1* | 12/2009 | Itoh | G05F 1/56 327/525 |
| 2014/0028248 A1* | 1/2014 | Irisawa | H02M 3/157 327/306 |

FOREIGN PATENT DOCUMENTS

| | | |
|---|---|---|
| EP | 0143493 A2 | 6/1985 |
| EP | 0632465 A1 | 1/1995 |
| JP | H11338560 A | 12/1999 |
| TW | 201108624 A | 3/2011 |

OTHER PUBLICATIONS

D.L. Terrell, "Op Amps, Design, application, and troubleshooting" REFEREX, (Dec. 31, 1996) DOI: https://www.elsevier.com/books/op-amps-design-application-and-troubleshooting/terrell/878-0-7506-9702-6 XP040425470.

Search Report from corresponding German application 102019114228.8 dated Dec. 16, 2019.

International Search Report and Written Opinion of the International Searching Authority, issued in PCT/EP2020/063430, dated Aug. 19, 2020; ISA/EP.

India Office Action dated Sep. 14, 2022 in corresponding Indian Application No. 202117039855 (5 pages).

* cited by examiner

ANALOGUE VOLTAGE PROGRAMMING

CROSS-REFERENCE TO RELATED APPLICATIONS

This application is a 371 U.S. National Phase of International Application No. PCT/EP2020/063430, filed May 14, 2020, which claims priority to German Patent Application No. 10 2019 114 228.8, filed May 28, 2019. The entire disclosures of the above applications are incorporated herein by reference.

FIELD

The disclosure relates to an analog circuit that makes it possible to variably set a voltage within defined limits.

BACKGROUND

Electronic circuits almost always require a reference voltage that is constant. Thus, it is both independent of the input voltage and stable, independent of the current consumption and sufficiently accurate, and remains within the desired tolerance range. However, it is also desirable that such a voltage can be variably set to a specific value depending on the application.

Digital circuit solutions are known in prior art for this purpose. However, they are problematic with respect to safety-relevant components and thus to VDE and UL approval procedures. In the case of product approvals, the relevant product standards must be complied with in each case. This results in requirements for the selection of approvable products. UL typically requires so-called "recognized components" to obtain approval in a device.

There are also analog IC devices, but they can be programmed digitally (e.g. via SPI). In practice, these also have the problem that difficulties can arise in the approval procedures at VDE and UL.

A required reference voltage can also be implemented by means of a simple voltage divider on the printed circuit board. In this case, the reference voltage can no longer be variably adjusted. Furthermore, programmable digital potentiometers are known in prior art. With these, a resistor network can be digitally programmed to the desired value via a controller.

The disadvantage is that, in one of the equipment options, the reference voltage is already defined in the production process. However, it is desirable to determine the specification later in the customer application. The user should be able to freely select the required reference voltage for his application within certain voltage limits, in order to connect a motor of his choice to the respective electronics.

Furthermore, the voltage must be generated analogously. If it is needed for safety-relevant circuits, it must not be possible to program/modify it via software.

It is therefore an object of the disclosure to overcome the aforementioned disadvantages and provide a circuit arrangement that is safe to handle and provides the option of setting the voltage within certain voltage limit. Preferably, after setting, this ensures that the voltage, once set, can no longer be changed for the designated purposes.

SUMMARY

The problem is solved by an analog circuit arrangement for variably setting a voltage $U_{out}$ within defined voltage limits, comprises a non-inverting adder with a positive input. A voltage divider includes at least a first stage and a second stage. It is connected to the positive input of the adder. At least one stage includes a parallel circuit of n resistors of each resistor is connected in series in a conduction path to an overcurrent protection.

It also includes at least one device for actively changing one or more of the overcurrent protection devices into a state that interrupts the respective affected conduction path.

The disclosure relates to an analog circuit arrangement for variably setting a voltage $U_{out}$ within defined voltage limits. It comprises a non-inverting adder with a positive input. A voltage divider, with at least a first stage and a second stage, is connected to the positive input of the adder. At least one stage comprises a parallel circuit of n resistors that are each connected in series in a conduction path to an overcurrent protection device. At least one device actively changes one or more of the overcurrent protection devices into a state that interrupts the respective affected conduction path by a deliberately initiated overcurrent.

In a particularly advantageous embodiment, the overcurrent protection devices are designed as fuses that are deliberately blown for deactivation.

In a likewise advantageous embodiment of the disclosure, the first stage, of the preferably two-stage voltage divider, is formed from a fixed resistor.

Controlled blowing of the fuses enables the total resistance of the parallel circuit to now be changed. Therefore, also the total voltage can be changed at the intermediate tap of the voltage divider that is connected to the input of the adder. As a result, the voltage $U_{out}$ at the output of the non-inverting adder can be changed or set.

Depending on which or how many of the fuses are blown, a different output voltage can be "programmed," or permanently set.

After completion of the measures of blowing or energizing the overcurrent protection devices, the remaining fuses, that are not blown, are locked against a blowing process. This means that once a voltage has been set, it can no longer be changed for the designated purpose once the locking process has been completed.

To ensure and check the function of the circuit, the reference voltage is read back via the ADC of a controller after completion of the blowing process. This detects irregularities or blowing processes that have not been successfully completed.

In a preferred embodiment of the disclosure, the device for "disabling the conduction paths in the parallel circuit of the voltage divider" is implemented as an emitter circuit with current feedback by an NPN transistor and a PNP transistor. The base is connected to the collector of the NPN transistor via an intermediate tap of another voltage divider.

It is also advantageous that the base of the NPN transistor is controlled by a microcontroller (μC), preferably via a series resistor. The control signal for blowing a respective fuse or overcurrent protection device can be provided. For example, it can be provided by a classic I/O output of a microcontroller (μC) or by a needle bed adapter.

A series resistor can be used to adjust the current flow into the base of the NPN transistor as desired. A pull-down resistor between base and emitter prevents uncontrolled switching on of the NPN transistor. Furthermore, the base can also be connected to another signal (LOCK), that provides for a possibly desired "fading out" or "deactivation" of the control signals.

According to the disclosure, the base connected to the signal port (LOCK) is, for this purpose, connected to the emitter of the NPN transistor via the pull-down resistor.

Further advantageous is an embodiment where the collector of the PNP transistor of the (respective) device for triggering the overcurrent protection devices, is or are connectable to the respective overcurrent protection devices in order to selectively bring the respectively connected overcurrent protection device into a state interrupting the respective conduction path.

In a likewise preferred embodiment of the disclosure, a circuit for deactivating or locking the device is provided. Accordingly, the device is configured to keep that state in a conduction path stable and to prevent it from being subsequently changed. For example, this prevents another tripping operation of an overcurrent protection device not yet tripped.

Another aspect of the present disclosure relates to a method for variably setting a voltage $U_{out}$ within defined voltage limits. This occurs by using a circuit arrangement as previously described. The method comprises the following step(s):

Selectively energizing one or more of the overcurrent protection devices with an overcurrent generated with the device to bring the respective conduction path into the electrically isolated state in each case. Changing the voltage of the voltage divider at the input and consequently at the output of the adder as intended.

It is further preferred to design the method in such a way that, after selective tripping or energizing one or more of the overcurrent protection devices with an overcurrent, the respective device connected to an overcurrent protection device, that has not yet been tripped or fuse not yet blown, is deactivated by the interlock circuit.

Other advantageous further developments of the disclosure are characterized in the dependent claims or are explained in more detail below with reference to the figures and together with a preferred embodiment of the disclosure.

DRAWINGS

The drawings described herein are for illustrative purposes only of selected embodiments and not all possible implementations, and are not intended to limit the scope of the present disclosure.

Figure 2:
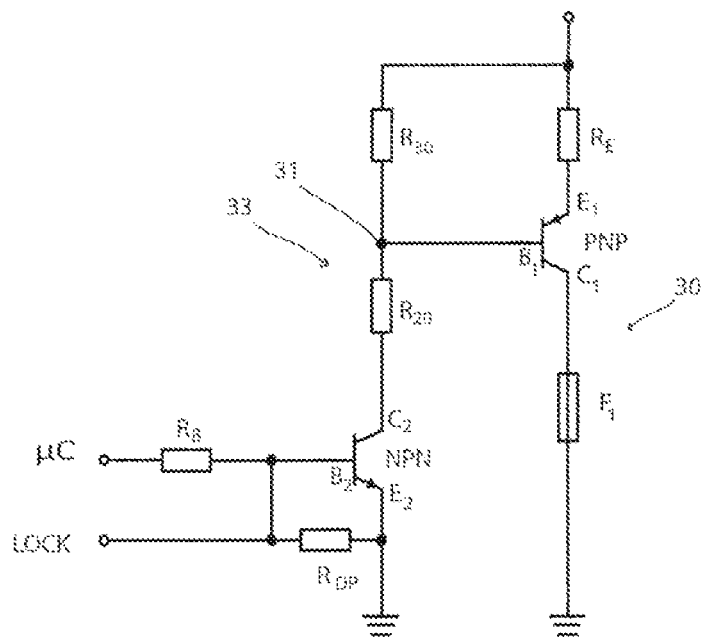
Figure 3:
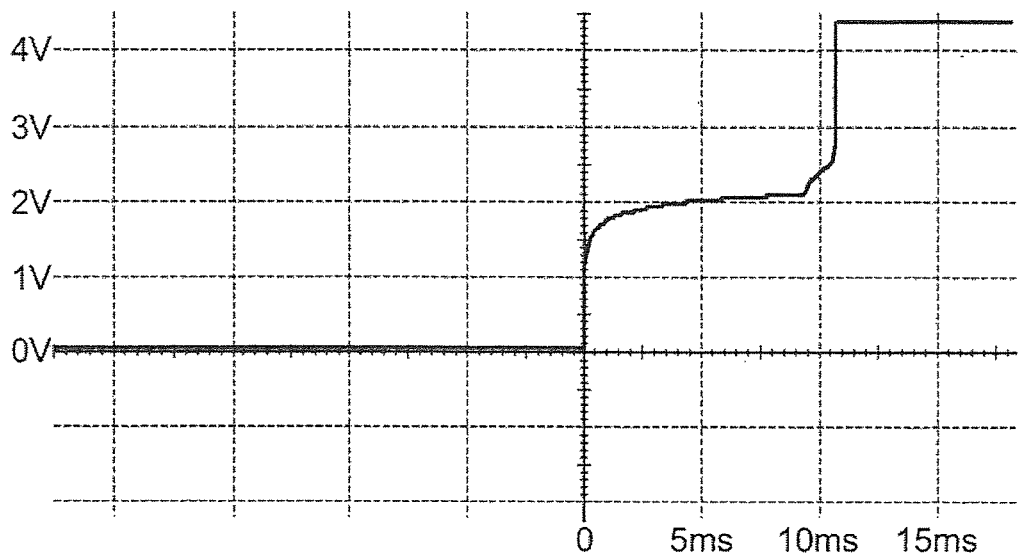
Figure 4:
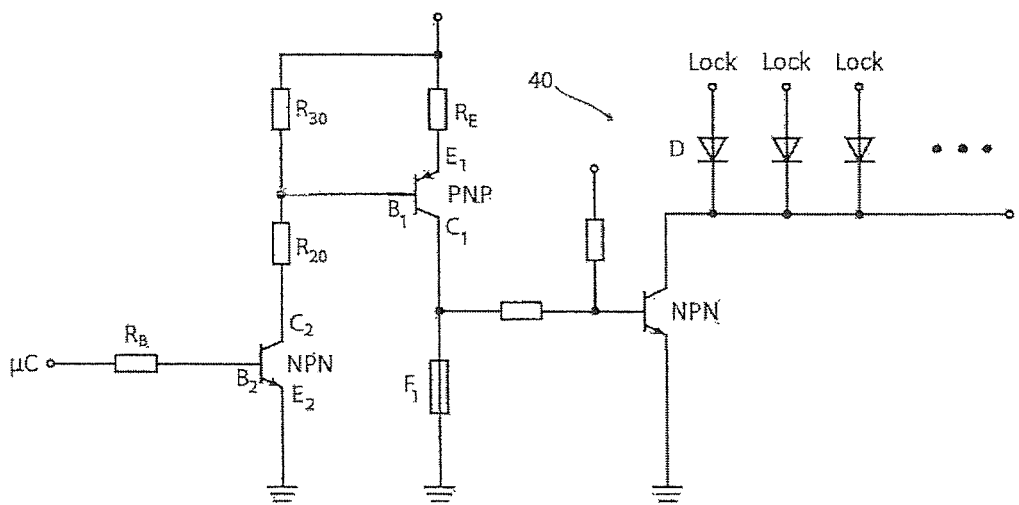
Figure 5:
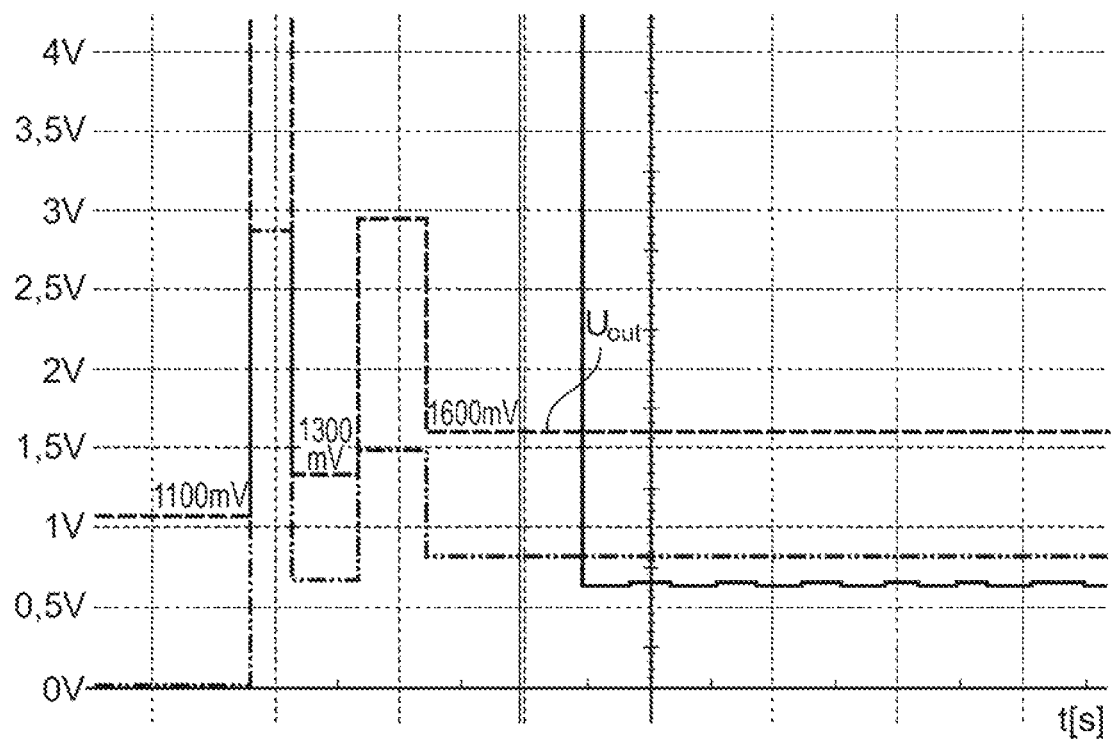

FIG. 1 is a schematic view of a circuit arrangement for adjustable voltage generation;

FIG. 2 is a schematic view of a circuit arrangement for tripping an overcurrent protection device or fuse, FIG. 3 is a schematic view of a diagram of the time sequence of a fuse tripping operation, FIG. 4 is a schematic view of a circuit arrangement for locking the circuit arrangement for triggering an overcurrent protection device according to FIG. 2, and FIG. 5 is a schematic view of an exemplary view of the time sequence for setting a desired voltage.

DETAILED DESCRIPTION

FIG. 1 is a circuit arrangement 1 according to the disclosure. The analog circuit arrangement 1 is configured to variably set a voltage $U_{out}$ within defined voltage limits at the non-inverting adder 10 shown.

The adder 10 has a positive input 11 and a negative input 12. The analog ground reference potential is designated AGND. A two-stage voltage divider 20 is connected to the positive input 11 of the adder 10. The voltage divider 20 includes a first stage 21, with a fixed resistor $R_f$, and a second stage 22. The second stage 22 includes a parallel circuit of 4 resistors R1, R2, R3, and R4. Each resistor R1, R2, R3, R4 is arranged in a parallel conduction path L1, L2, L3, and L4, respectively, between the ground reference potential and the center tap 23 on the voltage divider 20.

Each resistor R1, R2, R3, and R4 is connected in series to an overcurrent protection device F1, F2, F3, F4 in the respective line path L1, L2, L3, and L4. A resistor $R_X$ is provided in the conduction path running from the analog ground reference potential to the negative input 12 of adder 10. Another resistor $R_y$ is provided in the connection to the output at adder 10. The voltage $U_{out}$ to be set is present at the output of the adder 10. Thus, this depends on which of the overcurrent protection devices F1, F2, F3, F4 have been tripped as intended.

FIG. 2 shows a device 30 according to the disclosure for tripping an overcurrent protection device F1, F2, F3, F4. The device 30 is formed as an emitter circuit with current feedback by an NPN transistor and a PNP transistor, where the base is designated by B, the emitter is designated by E, and the collector is designated by C, respectively.

The base $B_1$ of the PNP transistor is connected to the collector $C_2$ of the NPN transistor via the intermediate tap 31 of the voltage divider 33. formed by the two resistors $R_{20}$, $R_{30}$.

The base $B_2$ of the NPN transistor is connected to a microcontroller μC via the series resistor $R_B$. Thus, the base can be controlled by the microcontroller μC. A series resistor $R_B$ can be used to adjust the current flow into the base of the NPN transistor as desired.

Base B2 is further connected to a signal port (LOCK), that is connected to the interlock circuit shown in FIG. 4. The purpose of this is to cause a possibly desired "fading out" or "deactivation" of the control signals in such a way that the overcurrent protection devices F1, F2, F3, F4, which have not yet been tripped as intended, are locked against tripping for any other than the intended purpose. The pull-down resistor $R_{DP}$ prevents uncontrolled switching on of the NPN transistor. Another resistor $R_E$ is provided upstream of the PNP transistor. This resistor is used to limit the current flow through the PNP transistor and the voltage drop across the PNP transistor.

Current flow into the NPN transistor causes it to become conductive. This results in current flow across both resistors $R_{20}$ and $R_{30}$. The required current flow into the base $B_1$ of the PNP transistor can be set accordingly if these two resistors $R_{20}$ and $R_{30}$. are dimensioned accordingly. This now results in the current flow via fuse F1, that must be dimensioned such that the fuse blows in the desired time. FIG. 3 shows a diagram of the time sequence of a fuse tripping operation.

For this purpose, the voltage that drops across the fuse was metrologically recorded. The current flow generated by the transistor first causes a potential rise at the fuse. The destruction process is underway. After about 11 ms, the fuse is completely blown and the entire voltage applied, minus the saturation voltage of the PNP transistor across the fuse, drops.

FIG. 4 shows a circuit arrangement for locking the circuit arrangement from tripping an overcurrent protection device according to FIG. 2.

The circuit 40 is also an emitter circuit with negative current feedback. In this embodiment, the fuse F1 is used to keep the other NPN transistor in the disabled state. As soon as fuse F1 has been tripped, as intended or has blown, the base of the NPN transistor is pulled to a higher potential. Thus, the transistor becomes conductive.

All control signals of the device 30 for tripping the fuses, except the signal for interlocking, are conducted to the collector of this NPN transistor via the diodes D shown. This leads to the fact that the respective affected devices 30 can no longer be activated. The "setting process" of the reference voltage is therefore irrevocably terminated after the fuse for locking has blown.

FIG. 5 shows an exemplary view of the time sequence for setting a desired voltage $U_{out}$.

The reference voltage to be set ($U_{out}$=upper curve) is at the potential of approx. 1100 mV before the tripping of a fuse F1. Now the first fuse F1 is blown first. After a trip from the first fuse F1, the reference voltage is at the voltage level of approx. 1300 mV. After that, the second fuse F2 is blown. The reference voltage $U_{out}$ has now reached the desired voltage level of about 1600 mV. After that, the interlock is activated to fix the obtained state.

Execution of the disclosure is not limited to the preferred exemplary embodiments mentioned above. Instead, a number of variants are conceivable which make use of the solution presented, even with fundamentally different designs.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. An analog circuit arrangement for variably setting a voltage $U_{out}$ within defined voltage limits, comprising a non-inverting adder with a positive input;
   a voltage divider, including at least a first stage and a second stage, is connected to the positive input of the adder,
   at least one stage includes a parallel circuit of n resistors (n≥2), each resistor is connected in series in a conduction path to an overcurrent protection device, and
   at least one device for actively changing one or more of the overcurrent protection devices into a state that interrupts the respective affected conduction path; and
   a circuit for deactivating the at least one device is also provided for locking the states of one or more of the overcurrent protection device(s).

2. The analog circuit arrangement according to claim 1, wherein the overcurrent protection devices are configured as fuses.

3. The analog circuit arrangement according to claim 1, wherein the first stage of the voltage divider includes a fixed resistor.

4. The analog circuit arrangement according to claim 1, wherein the device is implemented as an emitter circuit with negative current feedback by an NPN transistor (NPN) and a PNP transistor (PNP), the base of the PNP transistor is connected to the collector of the NPN transistor via an intermediate tap of a voltage divider comprising at least two resistors.

5. The analog circuit arrangement according to claim 4, wherein the base of the NPN transistor (NPN) is driven by a microcontroller.

6. The analog circuit arrangement according to claim 5, wherein the NPN transistor base is connected to the emitter of the NPN transistor via a pull-down resistor $R_{DP}$, and the base of the NPN transistor is connected to a signal port (LOCK) which, in turn, is connected to the interlock circuit.

7. The analog circuit arrangement according to claim 4, wherein a collector of the PNP transistor of the device to be capable of connection to the overcurrent protection devices, respectively, in order to selectively bring the respective connected overcurrent protection device into a state interrupting the respective conduction path.

8. A method for variably setting a voltage $U_{out}$ within defined voltage limits using a circuit arrangement according to claim 1, comprising the steps of:
   selectively energizing one or more of the overcurrent protection devices with an overcurrent generated with the device;
   bringing the respective conduction path into the electrically isolated state in each case;
   changing the voltage, as intended, of the voltage divider at the input of the adder.

9. The method according to claim 8, wherein after selectively energizing one or more of the overcurrent protection devices with an overcurrent, deactivating the respective at least one device for actively changing one or more of the one or more of the overcurrent protection devices by a circuit.

* * * * *